United States Patent
Obara

(10) Patent No.: US 11,145,492 B2
(45) Date of Patent: Oct. 12, 2021

(54) LOCAL DRY ETCHING APPARATUS

(71) Applicant: SpeedFam Co., Ltd., Kanagawa (JP)

(72) Inventor: Yasushi Obara, Ayase (JP)

(73) Assignee: SPEEDFAM CO., LTD., Kanagawa (JP)

( * ) Notice: Subject to any disclaimer, the term of this patent is extended or adjusted under 35 U.S.C. 154(b) by 90 days.

(21) Appl. No.: 16/584,035

(22) Filed: Sep. 26, 2019

(65) Prior Publication Data

US 2020/0135429 A1  Apr. 30, 2020

(30) Foreign Application Priority Data

Oct. 29, 2018 (JP) .............................. JP2018-203244

(51) Int. Cl.
*H01J 37/32* (2006.01)
*H01L 21/67* (2006.01)

(52) U.S. Cl.
CPC .. *H01J 37/32192* (2013.01); *H01L 21/67069* (2013.01); *H01J 2237/334* (2013.01)

(58) Field of Classification Search
CPC .......... H01J 37/32192; H01J 2237/334; H01L 21/67069; H01L 21/68764
USPC ................. 118/723 MW, 723 ME, 723 MR, 118/723 MA; 156/345.41, 345.42
See application file for complete search history.

(56) References Cited

U.S. PATENT DOCUMENTS

| 6,603,269 B1 * | 8/2003 | Vo ..................... H01J 37/32192 118/723 ME |
| 7,712,435 B2 * | 5/2010 | Yoshizaki ......... H01J 37/32559 118/723 E |
| 2001/0036741 A1 | 11/2001 | Tanaka et al. |

FOREIGN PATENT DOCUMENTS

| JP | 2000-208487 | 7/2000 |
| JP | 2008251674 A | * 10/2008 |

* cited by examiner

*Primary Examiner* — Rudy Zervigon
(74) *Attorney, Agent, or Firm* — Wenderoth, Lind & Ponack, L.L.P.

(57) ABSTRACT

A local dry etching apparatus includes a vacuum chamber that has a predetermined degree of vacuum therewithin, a nozzle including a first end and a second end, at least the first end of the nozzle open to the vacuum chamber, a discharge tube including a first end that is connected to the second end of the nozzle, a plasma generator provided in the discharge tube, an electromagnetic wave irradiation part configured to oscillate electromagnetic waves and connected to the discharge tube via the electromagnetic wave transmitter to introduce the oscillated electromagnetic waves to the plasma generator, and a spacer interposed between the nozzle and the discharge tube.

8 Claims, 8 Drawing Sheets

LOCAL DRY ETCHING APPARATUS

CROSS-REFERENCE TO RELATED APPLICATION

The present application is based on and claims priority from Japanese Patent Application No. 2018-203244 filed on Oct. 29, 2018, the disclosure of which is hereby incorporated by reference in its entirety.

FIELD OF THE INVENTION

The present disclosure relates to a local dry etching apparatus that locally processes a surface of a workpiece (material to be processed) such as a semiconductor wafer by dry etching.

BACKGROUND

A local dry etching apparatus that locally processes the surface of a workpiece such as a semiconductor wafer by dry etching is known in the art (See Patent Literature 1: JP2000-208487A1, for example). The principle of the process on the workpiece by such a local dry etching apparatus will be described with reference to FIG. 7.

The local dry etching apparatus includes a discharge tube 1, a gas supply device 2, a plasma generator 3, and a workpiece table 4. In the local dry etching apparatus, gas is supplied from the gas supply device 2 to the discharge tube 1, and microwaves M are transmitted from a microwave oscillator 5 of the plasma generator 3 into a waveguide 6 for causing plasma discharge of the gas in the discharge tube 1. Then, active species gas G generated by the plasma discharge is injected from a nozzle 7 of the discharge tube 1 onto a workpiece W placed on the workpiece table 4.

To process the surface of the workpiece W by dry etching, the workpiece table 4 with the workpiece W mounted thereon is moved by a table driving device (not shown) at controlled speed and pitches while injecting the active species gas G from the nozzle 7.

Before the process of the surface, the thickness of the workpiece W varies at positions and the surface has fine unevenness (i.e. concave and convex portions). Prior to the local dry etching for the flattening process, the thickness of each workpiece W at each sectioned area is measured by a known method. This measurement provides data on the thickness at a position in each area, that is, position-thickness data.

In the local dry etching, a removed amount of a material in each area corresponds to time during which the area is exposed to the active species gas G. Therefore, the relative speed of the nozzle 7 passing by the workpiece W is determined such that the nozzle 7 moves relatively slowly over a relatively thick portion Wa and relatively fast over a relatively thin portion Wb as shown in FIG. 8.

SUMMARY

In the known local dry etching apparatus, plasma is generated in a plasma generator provided in the discharge tube 1, which makes the plasma generator relatively hot. Heat in the plasma generator is transmitted to the nozzle 7 connected to the discharge tube 1 so that the nozzle 7 also becomes relatively hot.

The high temperature of the nozzle 7 causes the nozzle 7 to deteriorate and wear, and accordingly shortens the life of the nozzle 7.

To address the above issue, connection surfaces of the nozzle 7 and the discharge tube 1 are formed as a rough surface or an uneven surface, but the effects of such measures are limited.

Therefore, an object of the present disclosure is to provide a local dry etching apparatus capable of extending the life of the nozzle in an inexpensive and simple manner.

To achieve the above purpose, a local dry etching apparatus according to the present disclosure includes a vacuum chamber that has a predetermined degree of vacuum therewithin; a nozzle including a first end and a second end, at least the first end open to the vacuum chamber; a discharge tube including a first end that is connected to the second end of the nozzle; an electromagnetic wave irradiation part configured to irradiate electromagnetic waves to a plasma generator in the discharge tube to generate plasma in the plasma generator; and a spacer interposed between the nozzle and the discharge tube.

DETAILED DESCRIPTION

First Embodiment

Figure 1:
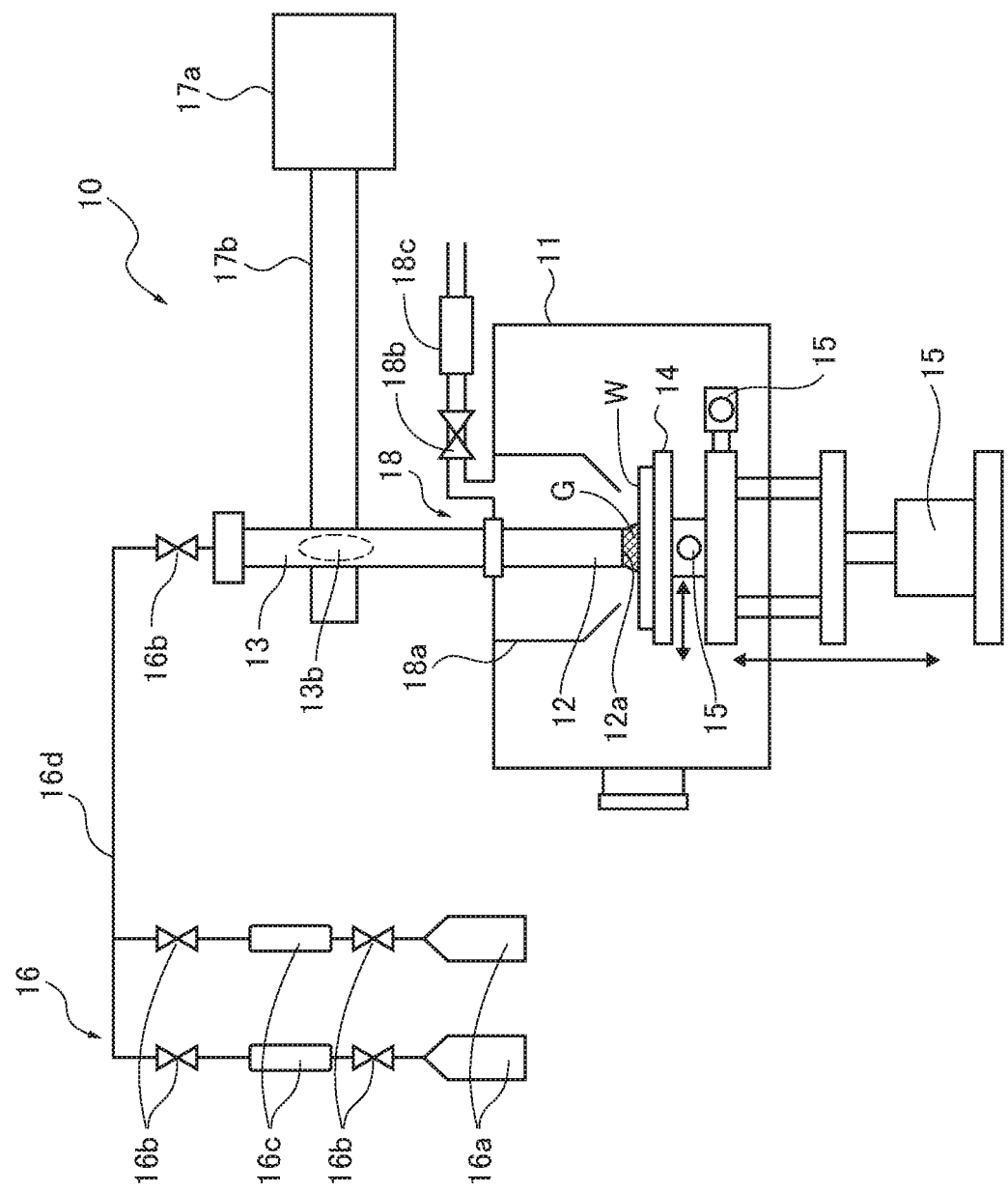
FIG. 1 is a view illustrating a general configuration of a local dry etching apparatus according to a first embodiment of the present disclosure.

Hereinafter, the present disclosure will be described with reference to drawings. FIG. 1 is a view illustrating a general configuration of a local dry etching apparatus according to a first embodiment of the present disclosure.

A local dry etching apparatus 10 according to this embodiment includes a vacuum chamber 11. A vacuum pump (not shown) is attached to the vacuum chamber 11. The vacuum pump evacuates the vacuum chamber 11 and maintains the inside of the vacuum chamber 11 at a predetermined degree of vacuum.

A nozzle 12 is attached to the vacuum chamber 11. More specifically, the nozzle 12 is attached to the vacuum chamber 11 with an injection port (i.e. a first end) 12a of the nozzle 12 facing a workpiece W. The injection port 12a is an opening of the nozzle 12. A first end 13a of a discharge tube 13 is attached to the other end (i.e. a second end) 12b of the nozzle 12 opposed to the injection port 12a (see also FIG. 2).

A workpiece table 14 for mounting the workpiece W thereon is disposed within the vacuum chamber 11. The workpiece W such as a silicon wafer or a semiconductor wafer to be processed by the local dry etching apparatus 10 in this embodiment is a thin plate. Further, a table driving device 15 for moving the workpiece table 14 is provided within the vacuum chamber 11. The table driving device 15 is configured to move the workpiece table 14 in a left and right direction, a front and back direction and a top and bottom direction of the workpiece W in FIG. 1. The left and right direction, and the front and back direction in FIG. 1 are collectively referred to as a plane direction. A table driving control device (not shown) is provided outside of the vacuum chamber 11. The table driving device 15 is controlled by the table driving control device with regard to the drive directions, the drive speed and the drive positions thereof.

In addition to the plane direction and the top and bottom direction, the drive direction of the workpiece table 14 by the table driving device 15 includes a rotational direction in which the workpiece W is moved about a rotation axis (not shown) which extends in the top and bottom direction in FIG. 1. Accordingly, the plane direction, the top and bottom direction, and the rotational direction may be combined as the drive direction of the workpiece table 14 as desired.

Raw material gas is supplied from a gas supply device 16 to the discharge tube 13. The discharge tube 13 includes a plasma generating portion 13b which is a part of the discharge tube 13. The local dry etching apparatus 10 further includes an electromagnetic wave irradiation part. The electromagnetic wave irradiation part includes an electromagnetic wave oscillator 17a (a magnetron, for example) configured to oscillate electromagnetic waves (microwaves or high-frequency waves, for example) and an electromagnetic wave transmitter 17b configured to introduce the oscillated electromagnetic waves to the plasma generator 13b. For example, the electromagnetic wave transmitter 17b may be a waveguide, a coaxial tube or the like when the electromagnetic waves are the microwaves, or the electromagnetic wave transmitter 17b may be a coaxial cable or the like when the electromagnetic waves are the high-frequency waves. The electromagnetic wave oscillator 17a is connected to the discharge tube 13 via the electromagnetic wave transmitter 17b. Thereby, the electromagnetic waves oscillated by the electromagnetic wave oscillator 17a are introduced to the plasma generating portion 13b via the electromagnetic wave transmitter 17b. The raw material gas through the discharge tube 13 is converted into plasma by irradiation of the electromagnetic waves. The electromagnetic wave oscillator 17a is controlled by an electromagnetic wave oscillator controller (not shown).

The gas supply device 16 includes a plurality of raw material gas reservoirs 16a filled with different kinds of raw material gases such as SF6, NF3, CF4, respectively, valves 16b configured to be opened or closed for the raw material gases, mass flow controllers 16c configured to control flow rates, and supply pipes 16d for connecting them and introducing the gases to the inlet of the discharge tube 13. The valves 16b are controlled by a valve controller (not shown) and the mass flow controllers 16c is controlled by a mass flow controller control device (not shown).

An exhaust unit 18 is disposed at the periphery of the nozzle 12. The exhaust unit 18 includes an exhaust duct 18a disposed to surround the nozzle 12, an exhaust valve 18b connected to the exhaust duct 18a, and an exhaust pump 18c.

The exhaust pump 18c of the exhaust unit 18 exhausts the reaction gas generated by the local dry etching to the outside of the vacuum chamber 11. The exhaust valve 18b and the exhaust pump 18c are controlled by an exhaust control device (not shown).

Figure 2:
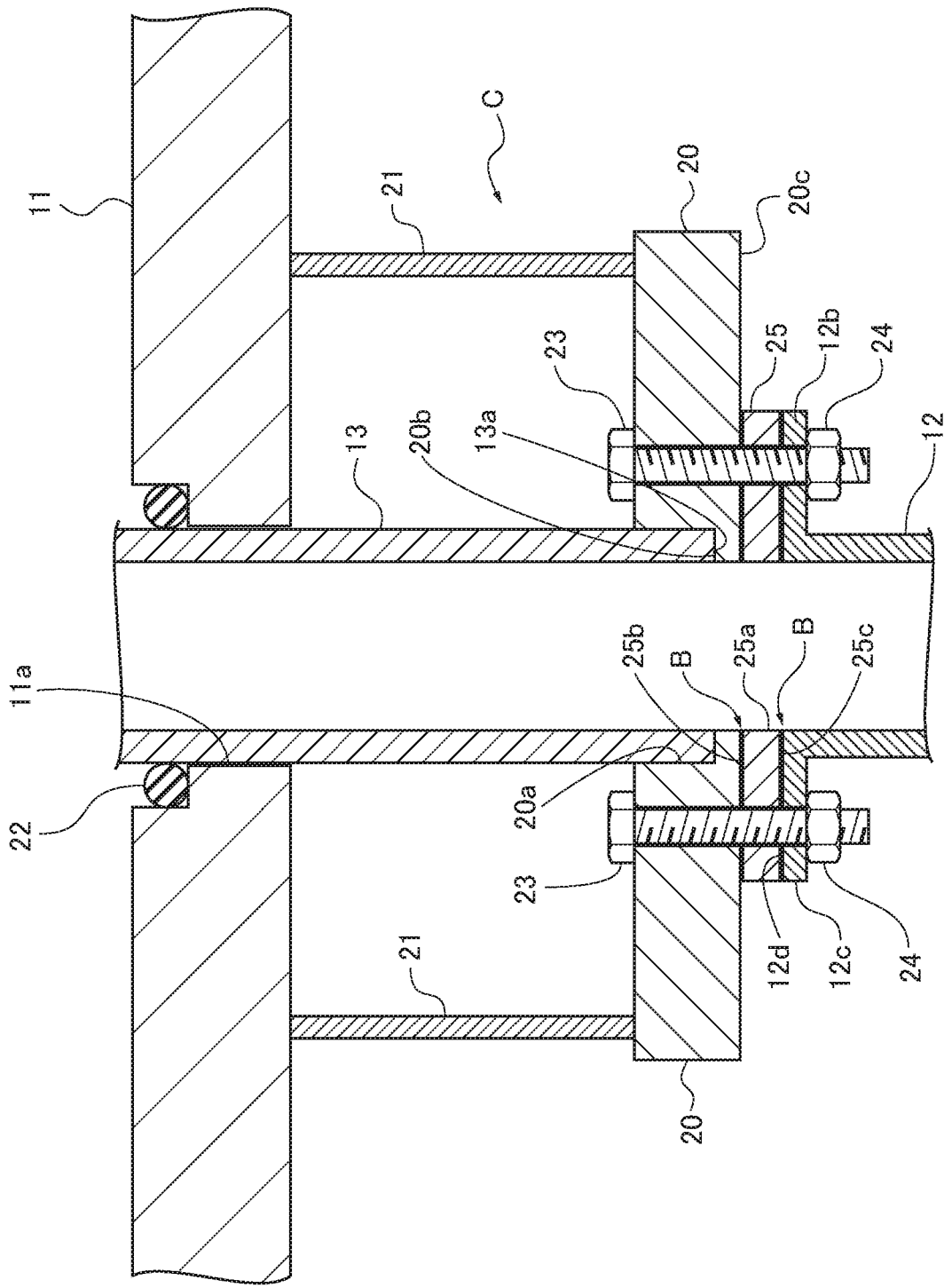
FIG. 2 is a cross-sectional view illustrating a connecting portion of a discharge tube and a nozzle in the local dry etching apparatus according to the first embodiment.

FIG. 2 is a cross-sectional view illustrating a connecting portion C of the discharge tube 13 and the nozzle 12 of the local dry etching apparatus 10 in the first embodiment.

As shown in FIG. 2, support stays 21 support a bracket 20 within the vacuum chamber 11. The bracket 20 is a flat plate and includes an opening 20a in the center thereof. The size of the opening 20a is set such that the first end 13a of the discharge tube 13 fits into the opening 20a. The first end 13a of the discharge tube 13 is mounted on a step portion 20b of the bracket 20. The step portion 20b is formed in the bracket 20 to partially define the opening 20a. Thereby, the discharge tube 13 is attached to the bracket 20 and accordingly the vacuum chamber 11.

The vacuum chamber 11 also includes an opening 11a. The size of the opening 11a is set such that the discharge tube 13 extends therethrough. The discharge tube 13 extends through the opening 11a and the first end 13a is located within the vacuum chamber 11. An O-ring 22 is provided on the inner circumference of the opening 11a. The O-ring 22 maintains airtightness in the vacuum chamber 11.

The nozzle 12 includes a nozzle flange 12c at the second end 12b. The nozzle flange 12c is fastened to a bottom surface (connection surface) 20c of the bracket 20 by bolts 23 and nuts 24, so that the first end 13a of the discharge tube 13 is connected to the second end 12b of the nozzle 12.

Figure 3:
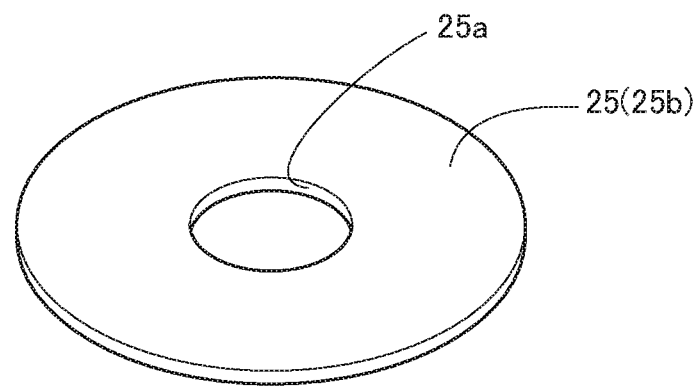
FIG. 3 is a perspective view illustrating an example of a spacer used for the local dry etching apparatus according to the first embodiment.

A spacer 25 is disposed between the bottom surface 20c of the bracket 20 and the nozzle flange 12c of the nozzle 12. As shown in FIG. 3, the spacer 25 is formed in a circular flat plate and includes an opening 25a in the center thereof. The size of the opening 25a is substantially equal to the inner diameter of the nozzle 12.

More specifically, a top surface 25b of the spacer 25 faces the bottom surface 20c of the bracket 20, and a bottom surface 25c of the spacer 25 faces a top surface (connection surface) 12d of the nozzle flange 12c. The bottom surface 20c of the bracket 20 and the top surface 12d of the nozzle flange 12c are formed as parallel surfaces relative to each other. Accordingly, interfaces B exist between the bottom surface 20c of the bracket 20 and the top surface 25b of the spacer 25, and between the bottom surface 25c of the spacer 25 and the top surface 12d of the nozzle flange 12c, respectively.

The material of the spacer 25 may be appropriately selected from known materials, but it is preferable to use a heat resistant material for the spacer 25 since the discharge tube 13 and the nozzle 12 become relatively hot. As an example, the spacer 25 is formed of the same material as the discharge tube 13 or the nozzle 12. For example, when the nozzle 12 is formed from aluminum with an anodized surface, the spacer 25 is also formed from aluminum with an anodized surface. Alternatively, the spacer 25 may be formed from a heat-resistant resin, for example, a so-called (super) engineering plastic such as a polyimide resin. The spacer 25 may be formed from a low thermal conductivity material.

Hereinafter, steps of local etching by the local dry etching apparatus 10 having the above configuration according to the embodiment will be described.

The position-thickness data of the workpiece W is assumed to have already been obtained. First, the workpiece W is supplied to the vacuum chamber 11 and mounted on the workpiece table 14 in the vacuum chamber 11, and the vacuum chamber 11 is evacuated by the vacuum pump (not shown) to a predetermined degree of vacuum. Alternatively, the workpiece W is supplied to the vacuum chamber 11 and mounted on the workpiece table 14 from a transport chamber (not shown) provided in the vacuum chamber 11 which has already been evacuated by the vacuum pump to a predetermined degree of vacuum.

Then, the valves 16b of the gas supply device 16 are opened, and the raw material gas in the raw material gas reservoirs 16a is supplied to the discharge tube 13 through the supply pipes 16d. Concurrently, electromagnetic waves are generated by the electromagnetic wave oscillator 17a. The generated electromagnetic waves are transmitted to the discharge tube 13 through the electromagnetic wave transmitter 17b.

By irradiating the electromagnetic waves to the plasma generating portion 13b of the discharge tube 13, the raw material gas passing through the discharge tube 13 is converted into plasma to generate the active species gas G. The generated active species gas G flows to the injection port 12a of the nozzle 12 and is then injected toward the surface of the workpiece W from the injection port 12a. The table driving device 15 relatively moves the workpiece table 14 on which the workpiece W is mounted such that the injection port 12a of the nozzle 12 scans the workpiece W.

The scanning speed when the nozzle 12 relatively moves in each of the sectioned areas of the workpiece W is controlled in accordance with the uneven profile such that the surface of the workpiece is planarized. As described above, the local dry etching is performed.

During the local dry etching by the local dry etching apparatus 10, the plasma generating portion 13b becomes relatively hot when the raw material gas is converted into plasma in the plasma generating portion 13b and the active species gas G is generated. The high temperature in the plasma generating portion 13b is conducted to the bracket 20 and then the nozzle 12 through the discharge tube 13.

Since the spacer 25 is interposed between the discharge tube 13 and the nozzle 12 (more precisely between the bracket 20 and the nozzle 12), a distance of heat conduction from the discharge tube 13 to the nozzle 12 becomes longer than that of a case without the spacer 25. Accordingly, interposing the spacer 25 weakens the heat conduction from the discharge tube 13 and suppresses the nozzle 12 from being relatively hot. Thereby, it is possible to extend the life of the nozzle 12 in an inexpensive and simple manner.

Particularly, the interfaces B exist between the bottom surface 20c of the bracket 20 and the top surface 25b of the spacer 25, and between the bottom surface 25c of the spacer 25 and the top surface 12d of the nozzle flange 12c, respectively. These interfaces B exist within the vacuum chamber 11 and accordingly provide a vacuum insulation effect. This further weakens the heat conduction from the discharge tube 13 and further suppresses the nozzle 12 from being relatively hot.

Second Embodiment

Figure 4:
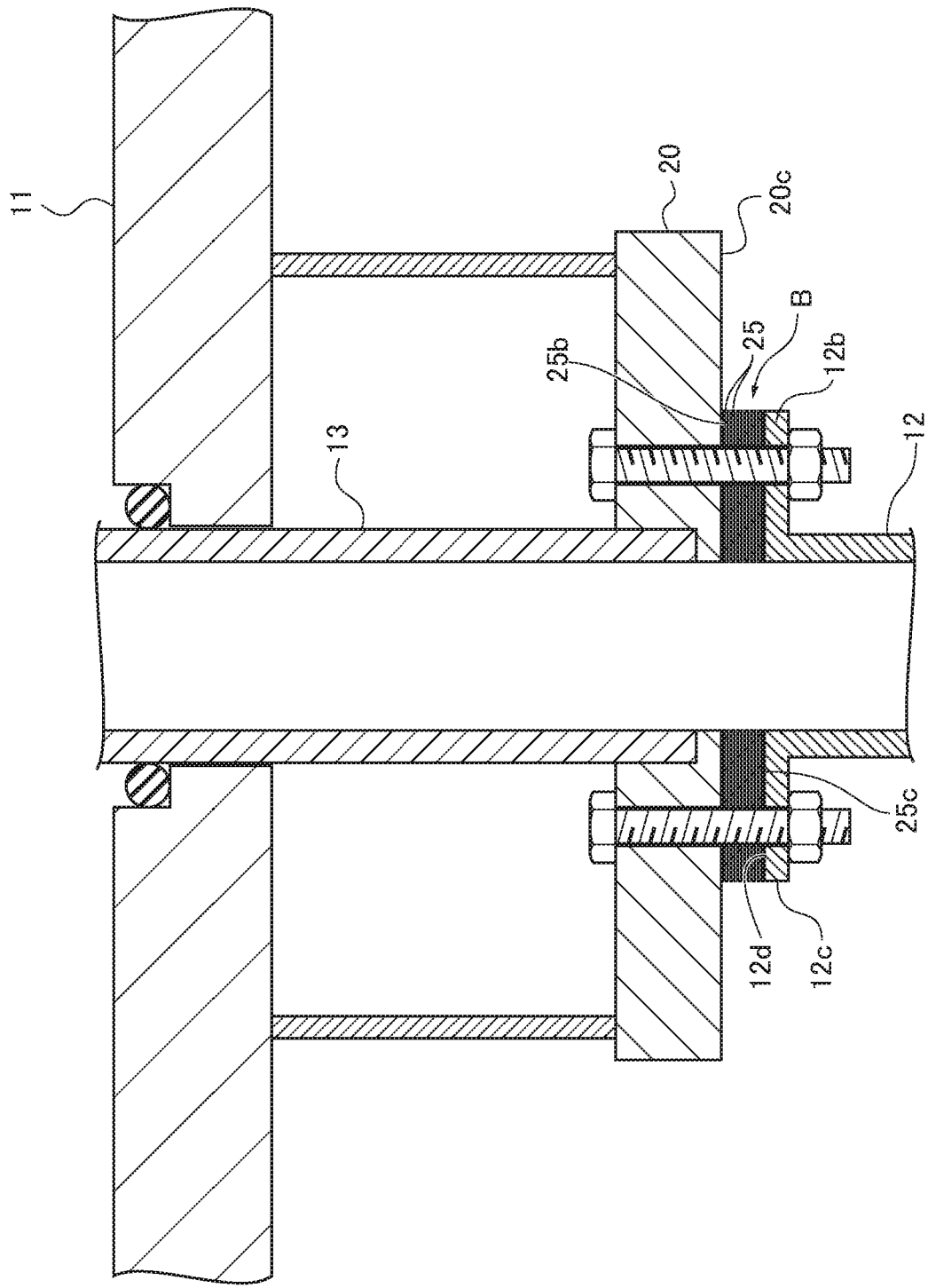
FIG. 4 is a cross-sectional view illustrating the contacting portion of the discharge tube and the nozzle in the local dry etching apparatus according to a second embodiment of the present disclosure.

In the local dry etching apparatus 10 according to the first embodiment, the single spacer 25 is interposed between the discharge tube 13 and the nozzle 12. However, the present disclosure is not limited to the interposition of a single spacer 25, but a plurality of spacers 25 having same shapes may be interposed between the discharge tube 13 and the nozzle 12 as shown in FIG. 4. In the embodiment shown in FIG. 4, a plurality of spacers 25 having same shapes and formed from the same material are interposed between the discharge tube 13 and the nozzle 12.

Thereby, the interfaces B exist between the bottom surface 20c of the bracket 20 and the top surface 25b of the spacer 25, and between the bottom surface 25c of the spacer 25 and the top surface 12d of the nozzle flange 12c as well as between the spacers 25, respectively. According to the local dry etching apparatus 10 of this embodiment, the increased number of the interfaces B provides a further vacuum insulation effect and additionally suppresses the nozzle 12 from being relatively hot. As a result, it is possible to extend the life of the nozzle 12 in an inexpensive and simple manner.

Third Embodiment

Figure 5:
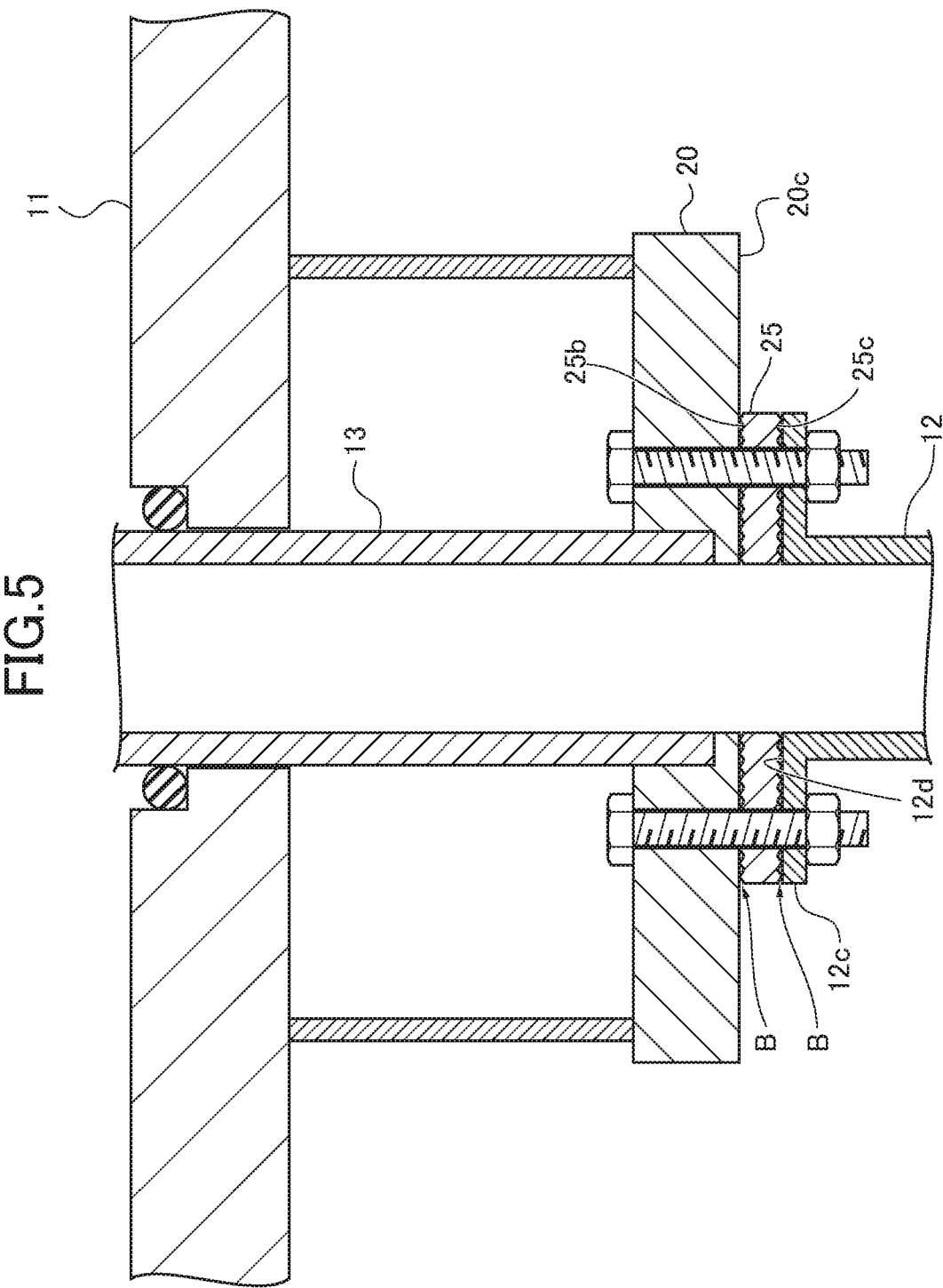
FIG. 5 is a cross-sectional view illustrating the contacting portion of the discharge tube and the nozzle in the local dry etching apparatus according to a third embodiment of the present disclosure.

To improve heat insulation of the interfaces B between the top surface 25b of the spacer 25 and the bottom surface 20c of the bracket 20, and between the bottom surface 25c of the spacer 25 and the top surface 12d of the nozzle flange 12c, the top surface 25b and the bottom surface 25c of the spacer 25 may be formed rougher than the bottom surface 20c of the bracket 20 and the top surface 12d of the nozzle flange 12c as shown in FIG. 5. Forming the top surface 25b and the bottom surface 25c of the spacer 25 as rougher surfaces reduces contact area at each interface B, which further suppresses the heat conduction through the spacer 25 and further improves the vacuum insulation effect. Thereby, it is possible to further suppress the nozzle 12 from being relatively hot. As a result, it is possible to further extend the life of the nozzle 12 in an inexpensive and simple manner.

Fourth Embodiment

Figure 6:
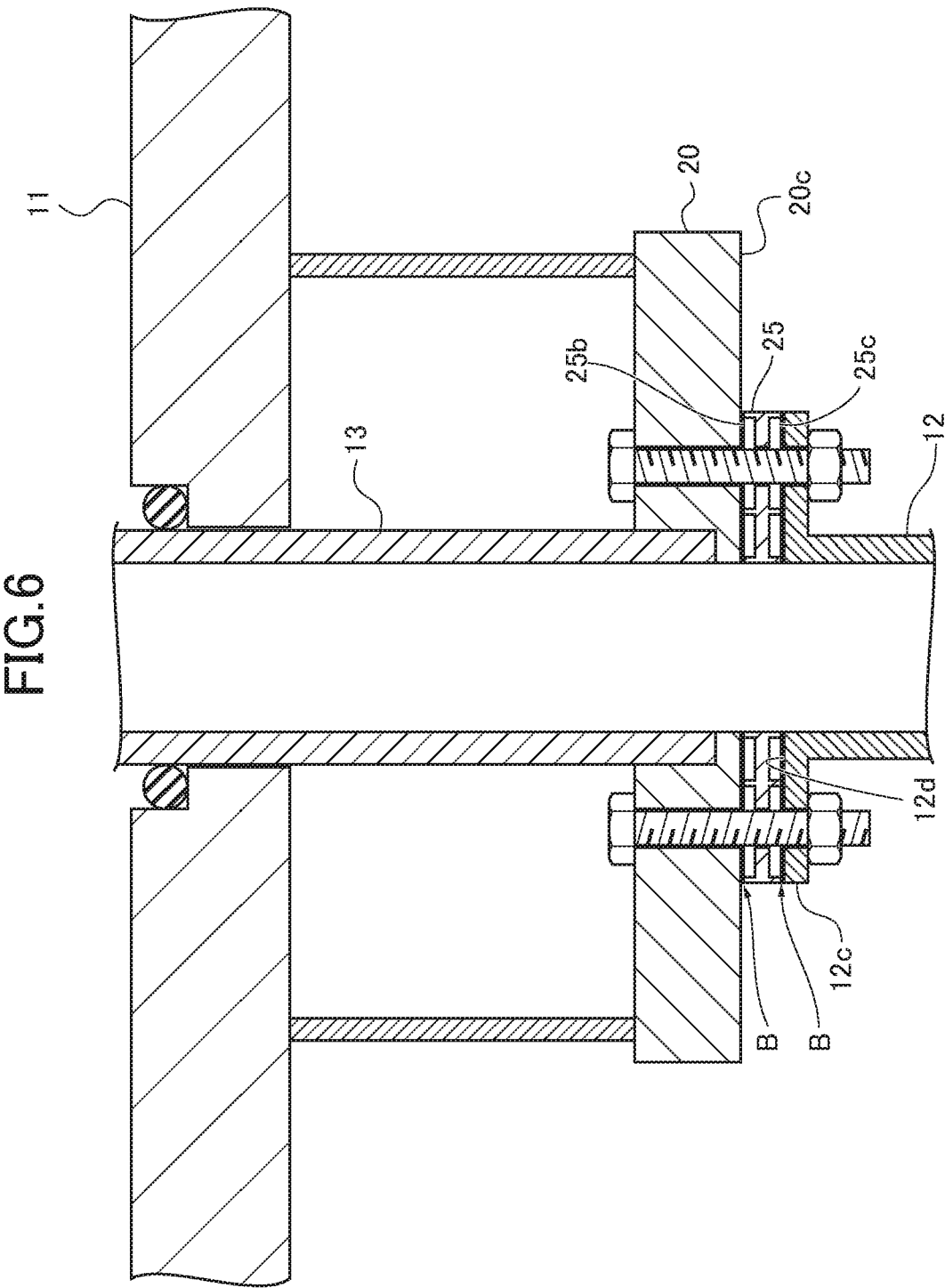
FIG. 6 is a cross-sectional view illustrating the contacting portion of the discharge tube and the nozzle in the local dry etching apparatus according to a fourth embodiment of the present disclosure.
Figure 7:
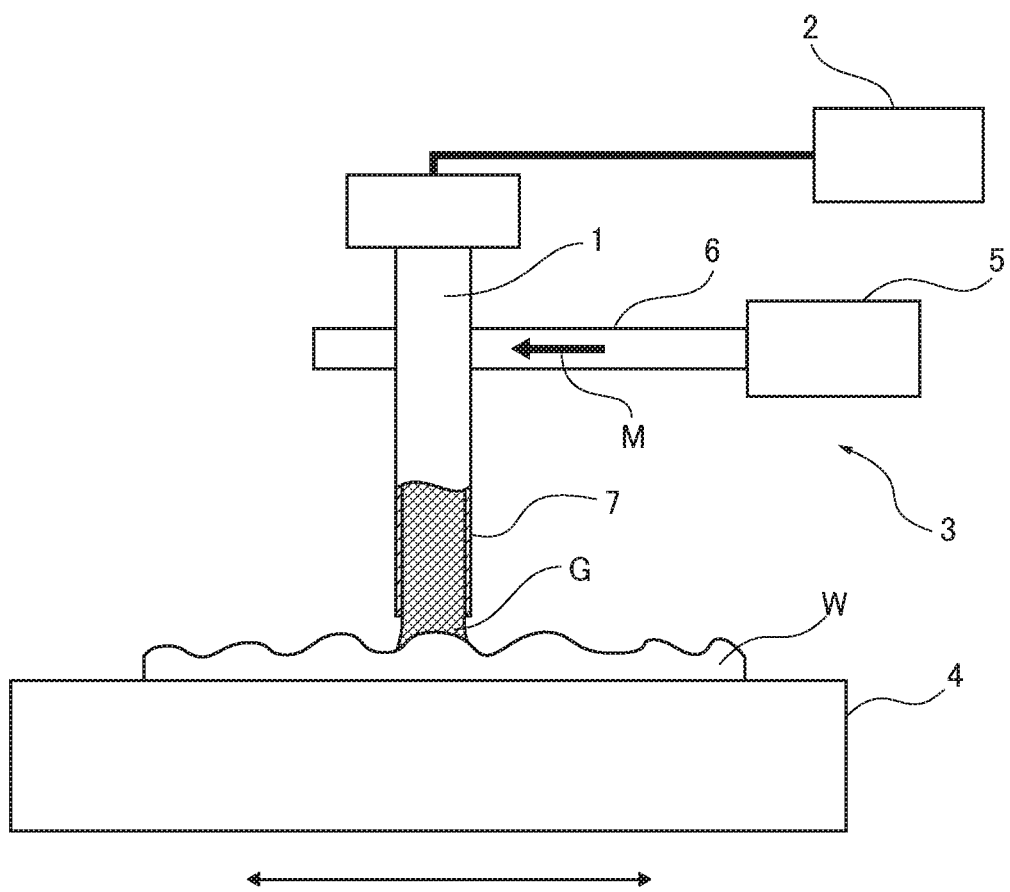
FIG. 7 is an explanatory view for explaining the principle of a process on a workpiece by a general local dry etching apparatus.
Figure 8:
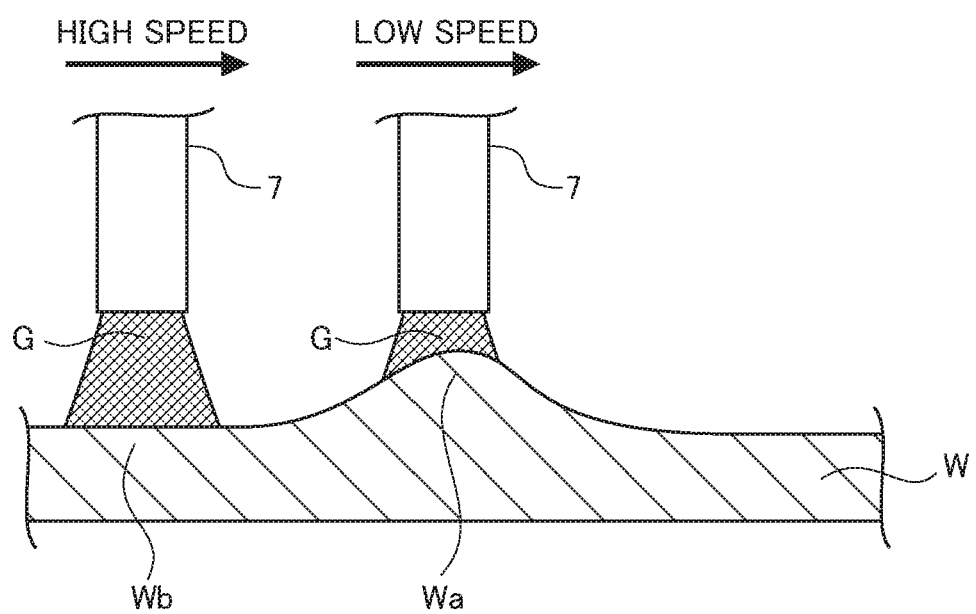
FIG. 8 is an explanatory view for explaining local etching by the general local dry etching apparatus.

To further improve the suppression effect of heat conduction by the spacer 25 in the third embodiment, the top surface 25b and the bottom surface 25c of the spacer 25 may be formed as uneven surfaces as shown in FIG. 6. In other words, the top surface 25b and the bottom surface 25c of the spacer 25 may have a plurality of convex and concave portions. Thereby, the contact area at each interface B can be reduced, which further suppresses the heat conduction through the spacer 25 and particularly further improves the vacuum insulation effect. Accordingly, it is possible to further prevent the nozzle 12 from being relatively hot. As a result, it is possible to further extend the life of the nozzle 12 in an inexpensive and simple manner.

The embodiments of the present disclosure have been described with reference to the drawings. The specific configurations of the present disclosure are not limited to the above embodiments and the examples, but the present disclosure includes design changes that do not deviate from the gist and scope of the present disclosure.

In the local dry etching apparatus 10 according to the above embodiments, the discharge tube 13 and the nozzle 12 are connected via the bracket 20. However, the discharge tube 13 and the nozzle 12 may be directly connected without the bracket 20.

In addition, the present disclosure includes configurations obtained by combining contents disclosed in the second to fourth embodiments as desired. For example, a plurality of spacers 25 each including the top surface 25b and the bottom surface 25c formed as rougher surfaces may be interposed between the discharge tube 13 and the nozzle 12.

Note that the terms "top" and "bottom" of the top surface 12d, 25b and the bottom surface 20c, 25c are only used in accordance with the drawings but are not limiting the positional relation of the surfaces, the nozzle 12, and the spacer 25.

What is claimed is:

1. A local dry etching apparatus comprising:
   a vacuum chamber that has a predetermined degree of vacuum therewithin;
   a nozzle comprising a first end and a second end, at least the first end of the nozzle open to the vacuum chamber;
   a discharge tube comprising a first end that is connected to the second end of the nozzle;
   a plasma generator provided in the discharge tube and configured to generate plasma in the discharge tube;
   an electromagnetic wave oscillator configured to oscillate electromagnetic waves and connected to the discharge tube via an electromagnetic wave transmitter to introduce the oscillated electromagnetic waves to the plasma generator; and
   a spacer interposed between the nozzle and the discharge tube,
   wherein each of the second end of the nozzle and the first end of the discharge tube comprises a connection surface,
   wherein the spacer comprises connection surfaces at positions facing the connection surface of the nozzle and facing the connection surface of the discharge tube, respectively,
   wherein the connection surface of the nozzle and the connection surface of the discharge tube are parallel to each other,
   wherein the spacer is a flat plate, and
   wherein at least one of the connection surfaces of the spacer that faces at least one of the connection surface of the nozzle and the connection surface of the discharge tube is formed as a rougher surface than the connection surface of the nozzle and the connection surface of the discharge tube.

2. A local dry etching apparatus comprising:
   a vacuum chamber that has a predetermined degree of vacuum therewithin;
   a nozzle comprising a first end and a second end, at least the first end of the nozzle open to the vacuum chamber;
   a discharge tube comprising a first end that is connected to the second end of the nozzle;
   a plasma generator provided in the discharge tube and configured to generate plasma in the discharge tube;
   an electromagnetic wave oscillator configured to oscillate electromagnetic waves and connected to the discharge tube via an electromagnetic wave transmitter to introduce the oscillated electromagnetic waves to the plasma generator; and
   a spacer interposed between the nozzle and the discharge tube,
   wherein each of the second end of the nozzle and the first end of the discharge tube comprises a connection surface,
   wherein the spacer comprises connection surfaces at positions facing the connection surface of the nozzle and facing the connection surface of the discharge tube, respectively,
   wherein the connection surface of the nozzle and the connection surface of the discharge tube are parallel to each other,
   wherein the spacer is a flat plate, and
   wherein at least one of the connection surfaces of the spacer that faces at least one of the connection surface of the nozzle and the connection surface of the discharge tube is formed as an uneven surface.

3. The local dry etching apparatus according to claim 1, wherein at least one of the connection surfaces of the spacer that faces at least one of the connection surface of the nozzle and the connection surface of the discharge tube is formed as an uneven surface.

4. A local dry etching apparatus comprising:
   a vacuum chamber that has a predetermined degree of vacuum therewithin;
   a nozzle comprising a first end and a second end, at least the first end of the nozzle open to the vacuum chamber;
   a discharge tube comprising a first end that is connected to the second end of the nozzle;
   a plasma generator provided in the discharge tube and configured to generate plasma in the discharge tube;
   an electromagnetic wave oscillator configured to oscillate electromagnetic waves and connected to the discharge tube via an electromagnetic wave transmitter to introduce the oscillated electromagnetic waves to the plasma generator; and
   a spacer interposed between the nozzle and the discharge tube,
   wherein each of the second end of the nozzle and the first end of the discharge tube comprises a connection surface,
   wherein the spacer comprises connection surfaces at positions facing the connection surface of the nozzle and facing the connection surface of the discharge tube, respectively,
   wherein the connection surface of the nozzle and the connection surface of the discharge tube are parallel to each other,
   wherein the spacer is a flat plate, and
   wherein the spacer is one of a plurality of spacers disposed between the nozzle and the discharge tube.

5. The local dry etching apparatus according to claim 1, wherein the spacer is one of a plurality of spacers disposed between the nozzle and the discharge tube.

6. The local dry etching apparatus according to claim 2, wherein the spacer is one of a plurality of spacers disposed between the nozzle and the discharge tube.

7. A local dry etching apparatus comprising:
   a vacuum chamber that has a predetermined degree of vacuum therewithin;
   a nozzle comprising a first end and a second end, at least the first end of the nozzle open to the vacuum chamber;
   a discharge tube comprising a first end that is connected to the second end of the nozzle;
   a plasma generator provided in the discharge tube and configured to generate plasma in the discharge tube;
   an electromagnetic wave oscillator configured to oscillate electromagnetic waves and connected to the discharge tube via an electromagnetic wave transmitter to introduce the oscillated electromagnetic waves to the plasma generator; and
   a spacer interposed between the nozzle and the discharge tube,
   wherein each of the second end of the nozzle and the first end of the discharge tube comprises a connection surface,
   wherein the spacer comprises connection surfaces at positions facing the connection surface of the nozzle and facing the connection surface of the discharge tube, respectively, wherein the connection surface of the nozzle and the connection surface of the discharge tube are parallel to each other, wherein the spacer is a flat plate, and wherein the connection surface of the spacer is parallel to the connection surfaces of the nozzle and the discharge tube.

8. A local dry etching apparatus comprising:

a vacuum chamber that has a predetermined degree of vacuum therewithin;

a nozzle comprising a first end and a second end, at least the first end of the nozzle open to the vacuum chamber;

a discharge tube comprising a first end that is connected to the second end of the nozzle;

a plasma generator provided in the discharge tube and configured to generate plasma in the discharge tube;

an electromagnetic wave oscillator configured to oscillate electromagnetic waves and connected to the discharge tube via an electromagnetic wave transmitter to introduce the oscillated electromagnetic waves to the plasma generator;

a spacer interposed between the nozzle and the discharge tube; and a bracket with an opening for receiving the first end of the discharge tube, wherein each of the second end of the nozzle and the first end of the discharge tube comprises a connection surface, wherein the spacer comprises connection surfaces at positions facing the connection surface of the nozzle and facing the connection surface of the discharge tube, respectively, wherein the second end of the nozzle comprises a flange, and the connection surface of the nozzle is provided on the flange, and wherein the spacer is interposed between the bracket and the flange.

* * * * *